US010770888B2

(12) United States Patent
Minagawa

(10) Patent No.: US 10,770,888 B2
(45) Date of Patent: Sep. 8, 2020

(54) OVERCURRENT PROTECTION DEVICE FOR SEMICONDUCTOR DEVICE

(71) Applicant: FUJI ELECTRIC CO., LTD., Kawasaki (JP)

(72) Inventor: Kei Minagawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 223 days.

(21) Appl. No.: 15/876,274

(22) Filed: Jan. 22, 2018

(65) Prior Publication Data

US 2018/0145503 A1    May 24, 2018

Related U.S. Application Data

(63) Continuation of application No. PCT/JP2016/088530, filed on Dec. 22, 2016.

(30) Foreign Application Priority Data

Feb. 17, 2016    (JP) ................. 2016-028358

(51) Int. Cl.
*H02H 7/12* (2006.01)
*H02M 1/00* (2006.01)
(Continued)

(52) U.S. Cl.
CPC ....... *H02H 7/1216* (2013.01); *G01R 19/0053* (2013.01); *H02H 1/0007* (2013.01);
(Continued)

(58) Field of Classification Search
CPC .......................... H02H 7/1216; G01R 19/0053
(Continued)

(56) References Cited

U.S. PATENT DOCUMENTS 5,375,029 A * 12/1994 Fukunaga ............... G05F 1/573
323/285
5,729,032 A    3/1998 Tomomatsu et al.
(Continued)

FOREIGN PATENT DOCUMENTS

JP    6-120787    4/1994
JP    7-240516    9/1995
(Continued)

OTHER PUBLICATIONS

Fuji Electric Co. Ltd "Fuji IGBT V-IPM Application Manual," Jul. 2015, pp. 1-180.
(Continued)

*Primary Examiner* — Christopher E Mahoney

(57) ABSTRACT

The overcurrent protection device includes: a current detection unit configured to detect, as a sense voltage, a sense current flowing through a current sense terminal of a voltage-controlled semiconductor device; an overcurrent detection unit configured to compare the sense voltage detected by the current detection unit with an overcurrent threshold value to output an overcurrent detection signal; a mode determination unit configured to determine whether a superposition mode in which a transient sense voltage is superimposed on the sense voltage or a normal mode in which the transient sense voltage is not superimposed on the sense voltage; and a timing adjustment unit configured to adjust a detection start timing of the overcurrent detection signal based on a result of determination by the mode determination unit.

8 Claims, 7 Drawing Sheets

(51) Int. Cl.
  *H02M 1/32* (2007.01)
  *G01R 19/00* (2006.01)
  *H03K 17/28* (2006.01)
  *H02H 1/00* (2006.01)
  *H02M 1/08* (2006.01)
  *H02M 5/458* (2006.01)
  *H02M 7/5387* (2007.01)
  *H03K 17/082* (2006.01)

(52) U.S. Cl.
  CPC .............. *H02M 1/00* (2013.01); *H02M 1/08* (2013.01); *H02M 1/32* (2013.01); *H02M 5/458* (2013.01); *H02M 7/5387* (2013.01); *H03K 17/0828* (2013.01); *H03K 17/28* (2013.01); *H02M 2001/0009* (2013.01)

(58) Field of Classification Search
  USPC ........................................................ 324/102
  See application file for complete search history.

(56) References Cited

U.S. PATENT DOCUMENTS

| | | | | |
|---|---|---|---|---|
| 6,057,728 | A | 5/2000 | Igarashi | |
| 6,633,473 | B1* | 10/2003 | Tomomatsu | H01L 29/7395 |
| | | | | 257/E29.198 |
| 8,466,734 | B2 | 6/2013 | Mori | |
| 9,476,916 | B2 | 10/2016 | Minagawa | |
| 2010/0288755 | A1* | 11/2010 | Czimmek | H03K 9/06 |
| | | | | 219/665 |
| 2012/0013370 | A1 | 1/2012 | Mori | |
| 2014/0021893 | A1* | 1/2014 | Komatsu | H02H 3/08 |
| | | | | 318/400.22 |
| 2014/0192449 | A1 | 7/2014 | Shimizu | |
| 2014/0375333 | A1 | 12/2014 | Minagawa | |
| 2016/0211657 | A1* | 7/2016 | Hayashi | H03K 17/14 |
| 2017/0214313 | A1* | 7/2017 | Kikuchi | H02H 3/093 |
| 2018/0316182 | A1* | 11/2018 | Minagawa | H03K 17/0828 |

FOREIGN PATENT DOCUMENTS

| | | |
|---|---|---|
| JP | 11-112313 A | 4/1999 |
| JP | 2012-23899 | 2/2012 |
| JP | 2014110497 A | 6/2014 |
| WO | WO 2013/008452 A1 | 1/2013 |
| WO | WO 2013/190752 A1 | 12/2013 |
| WO | 2015114788 A1 | 8/2015 |

OTHER PUBLICATIONS

International Search Report dated Mar. 28, 2017, in corresponding International Patent Application No. PCT/JP2016/088530.
English Translation by WIPO of the International Preliminary Report on Patentability dated Aug. 30, 2018 in corresponding International Patent Application No. PCT/JP2016/088530, 6 pgs.
Japanese Office Action dated Apr. 23, 2019 in corresponding Japanese Patent Application No. 2017-567970 (3 pages).
Japanese Office Action dated Oct. 23, 2019 in corresponding Japanese Patent Application No. 2017-567970.
Decision of Refusal dated May 19, 2020, in Japanese Patent Application No. 2017-567970 (2 pages total including machine translation).
Decision of Dismissal of Amendment dated May 19, 2020, in Japanese Patent Application No. 2017-567970 (6 pages total including machine translation).

* cited by examiner

FIG. 3
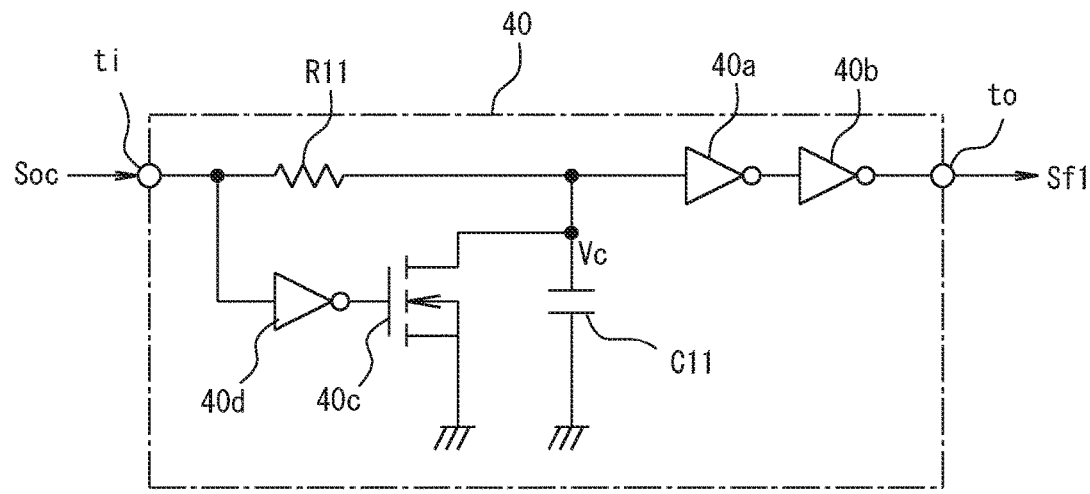
FIG. 4A
FIG. 4B
FIG. 4C
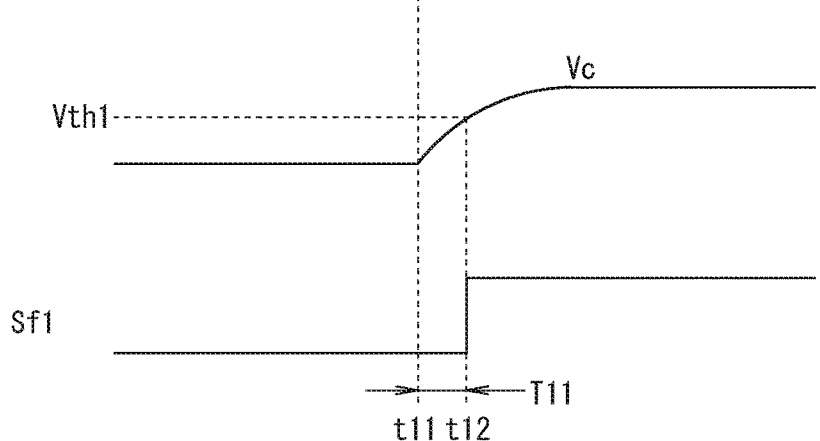

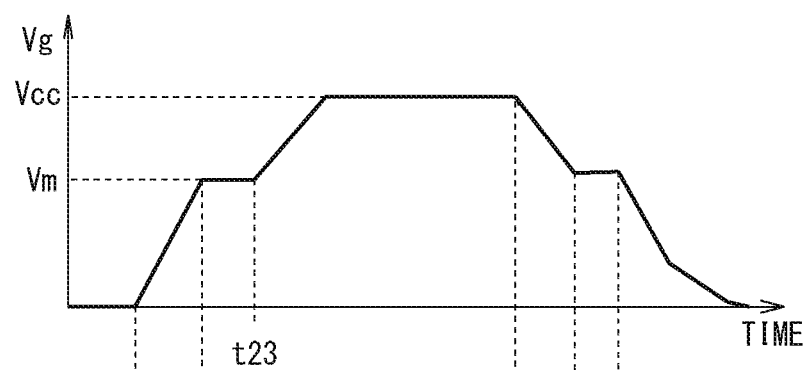
FIG. 5A
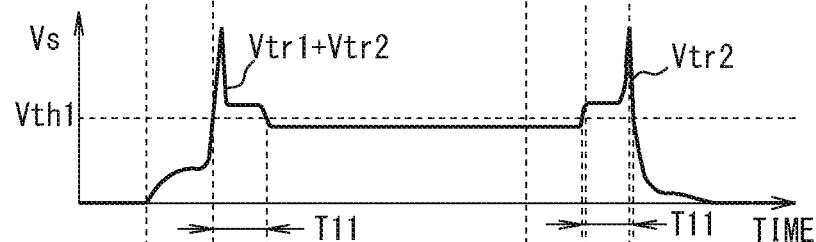
FIG. 5B
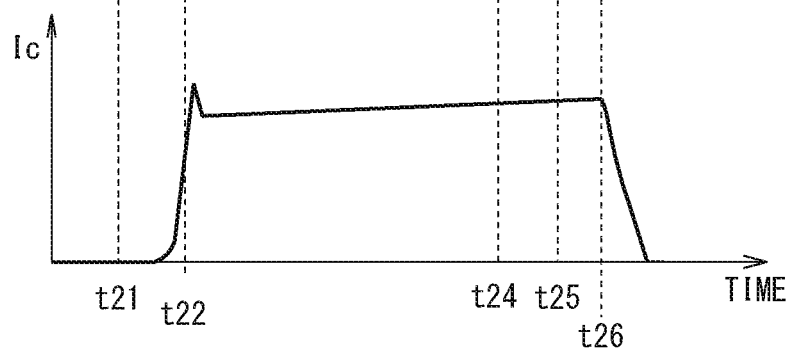
FIG. 5C
FIG. 6
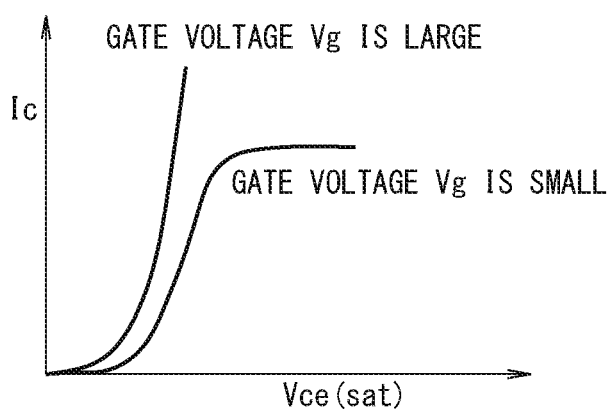

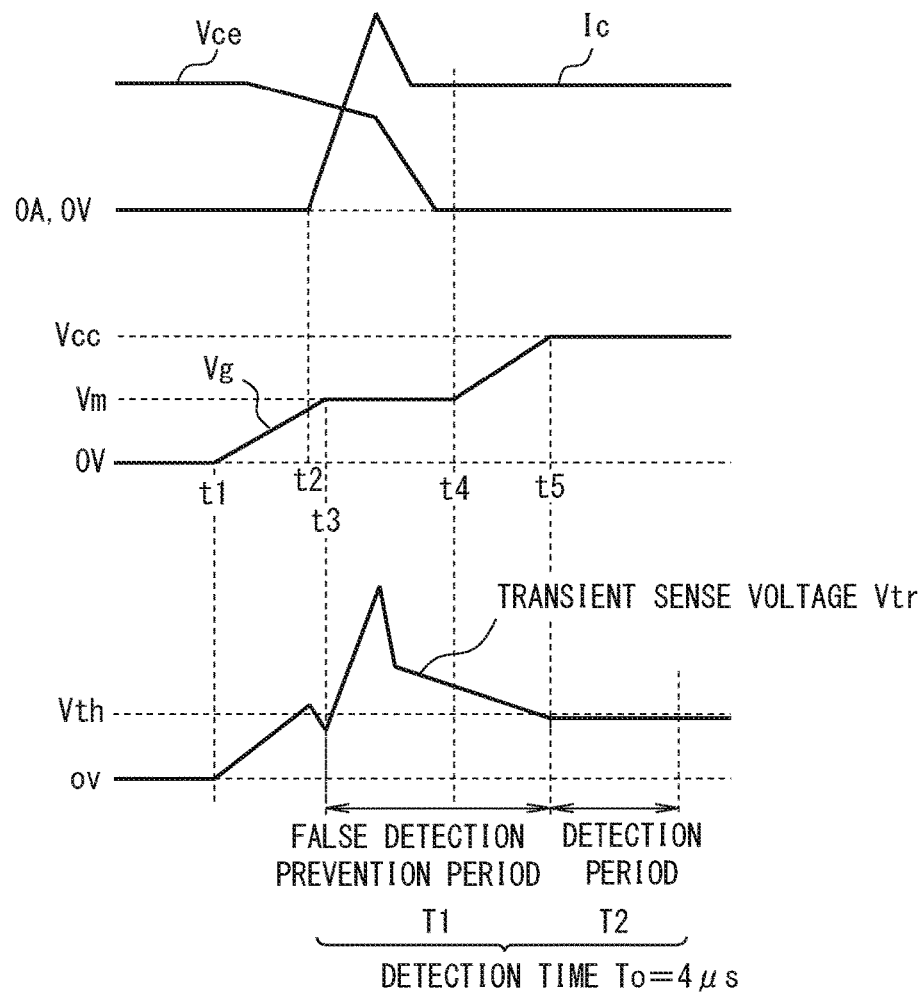

OVERCURRENT PROTECTION DEVICE FOR SEMICONDUCTOR DEVICE

CROSS REFERENCE TO RELATED APPLICATIONS AND INCORPORATION BY REFERENCE

This application is a continuation application filed under 35 U.S.C. § 111(a) of International Patent Application No. PCT/JP2016/088530, filed Dec. 22, 2016, which claims the foreign priority benefit under 35 U.S.C. § 119 of Japanese Patent Application No. 2016-028358, filed Feb. 17, 2016, the contents of which are incorporated herein by reference.

TECHNICAL FIELD

The present invention relates to an overcurrent protection device for a semiconductor device used for a power conversion device.

BACKGROUND ART

Conventionally, when driving insulated gate bipolar transistors (IGBT), which are voltage-driven semiconductor devices, it is known to provide an overcurrent protection circuit to protect IGBTs from overcurrent (for example, NPL 1). A common method of detecting overcurrent in such an overcurrent protection circuit is to use a current sense IGBT, shunting about one ten thousandth of the collector current of the main IGBT (sense current) to the sense IGBT and directing the sense current from the sense IGBT to a current detection resistor to compare the voltage obtained (sense voltage) with a reference voltage by a comparator.

The sense voltage is used to determine the magnitude of the current, on the basis of which a logic circuit causes an alarm to be outputted or the gate voltage to be shut down. FIGS. 10A to 10C illustrate a switching waveform when an IGBT is turned on. As illustrated in FIG. 10B, when at time t1 gate voltage Vg is applied to the gate terminal, the gate current charges the gate capacitance and the gate voltage starts to gradually increase. This leads to a relatively gradual decrease in the collector-emitter voltage Vce of the IGBT as illustrated in FIG. 10A. Then, when the gate voltage equals the on-voltage at time t2, the collector current Ic starts to flow. Subsequently, when the gate voltage Vg equals the Miller voltage Vm at time t3 and the Miller period starts, the collector current Ic starts to flow. At this time, the collector current Ic sharply increases and, after overshooting, shifts to a steady current state.

During the Miller period, fluctuations in the collector-emitter voltage Vce change the gate-collector capacitance Cgc and, to charge and discharge the gate-collector capacitance Cgc, the gate voltage is kept constant. The Miller period ends at time t4 after the collector-emitter voltage Vce decreases to 0V, and the gate voltage Vg starts to increase again and becomes constant at time t5 when it equals the power source voltage Vcc.

At this time, the gate current flowing between the gate and the emitter of the sense IGBT to charge the gate capacitance flows to the current detection resistor, causing transient sense voltage Vtr in the sense voltage Vs of the IGBT during the turn-on time, as illustrated in FIG. 10C. Also, during the turn-on time and the turn-off time, the gate voltage is lower than the power source voltage Vcc and the on-voltage i.e. on-resistance of the IGBT is larger, and consequently the ratio of resistance of the sense unit consisting of the on-resistance of the sense IGBT and the current detection resistor becomes relatively small, which results in increased sense current, leading to an occurrence of transient sense voltage Vtr as a function of the increased sense current.

Therefore, during the turn-on time the above-described two transient sense voltages Vtr are superimposed onto the sense voltage Vs and the sense voltage Vs thereby becomes higher than the overcurrent threshold voltage Vth. When the gate voltage Vg equals the power source voltage Vcc, the sense voltage Vs on which the transient sense voltages Vtr is superimposed becomes lower than the overcurrent threshold voltage Vth and then becomes constant.

Accordingly, during the turn-on time, the sense voltage Vs corresponding to the current outputted from the current sense terminal of the IGBT is in a superposition mode, in which transient sense voltage Vtr is superimposed, and then shifts to a normal mode, in which the transient sense voltage is not superimposed due to the gate voltage having reached the power source voltage. Also during the turn-off time, the sense voltage Vs is in the superposition mode, in which the transient sense voltage Vtr due to the fall of the gate voltage Vg is superimposed onto the sense voltage Vs.

In the superposition mode, the sense voltage exceeds the overcurrent threshold voltage as transient sense voltage is superimposed and, in this state, an overcurrent detection circuit would detect an overcurrent state, which would be a false detection. To prevent such a false detection, as illustrated in FIG. 10C, it is necessary to set a false overcurrent detection prevention period T1 (for example, 3 μs, during which the outputs from the overcurrent detection circuit are invalidated) that corresponds to the period during which the sense voltage exceeds the overcurrent threshold voltage as well as to set a detection period T2 of a certain duration (for example, 1 μs) after the false overcurrent detection prevention period T1, thereby setting a detection time T0 (for example, 4 μs), which is the sum of both periods.

To prevent such false detection of an overcurrent state, it has been proposed, as recited in PTL 1, to set the gate threshold voltage $V_{GE(th)\_S}$ of the sense IGBT cell forming the sensing circuit at a larger value than the gate threshold voltage $V_{GE(th)\_M}$ the main IGBT cell forming the main circuit to delay the rise of the main current in the sensing circuit with a time lag Δt during the turn-on period in comparison with the main current of the main circuit to prevent surge current from appearing in the sensing current. In this case, surge current is prevented from appearing also during the turn-off time.

CITATION LIST

Patent Literature

PTL 1: JP H07-240516

Non Patent Literature

NPL 1: Fuji IGBT V-IPM Application Manual, Internet<URL: https://www.fujielectric.co.jp/products/semiconductor/model/igbt/application/box/doc/pdf/RH985b/RH985b_all.pdf>

SUMMARY OF INVENTION

Technical Problem

However, the length of the above-described false overcurrent detection prevention period T1 suitable to the turn-on time and the turn-off time may be too long to cope with an overcurrent occurring in the regular ON time, which is neither turn-on nor turn-off time, and overcurrent protection may not operate in time. Note, however, that during the regular ON time, it is necessary to set a false detection prevention period to eliminate the effects of noise.

In addition, the conventional example recited in PTL 1 has disadvantages that it is necessary to set the gate threshold voltage $V_{GE(th)\_S}$ of the sense IGBT at a larger value than the gate threshold voltage $V_{GE(th)\_M}$ of the main IGBT, which makes it not easy to set the gate threshold voltage and that the time lag $\Delta t$ is fixed, which makes it difficult to adjust the time lag $\Delta t$ even when it is desired to change the time lag $\Delta t$. The conventional example has a further disadvantage in that no false detection prevention period is set for the regular ON time.

The present invention, therefore, has been made to address the above-described disadvantages of the conventional example, and an object of the present invention is to provide an overcurrent protection device for a semiconductor device adapted to respond in a short time during the regular ON time period and also to prevent false detection in overcurrent detection during the turn-on time and the turn-off time, without making the gate threshold voltage of the sense IGBT cell relative to the main IGBT cell and without adjusting the rise of the current through the sense IGBT cell relative to the main circuit IGBT cell.

Solution to Problem

In order to achieve the object mentioned above, according to an aspect of the present invention, there is provided an overcurrent protection device for a semiconductor device, the overcurrent protection device detecting a current of a voltage-controlled semiconductor device having a current sense terminal by using the current sense terminal to perform overcurrent protection, the overcurrent protection device including: a current detection unit configured to detect, as a sense voltage, a sense current flowing through the current sense terminal; an overcurrent detection unit configured to compare the sense voltage detected by the current detection unit with an overcurrent threshold value to output an overcurrent detection signal; a mode determination unit configured to determine whether a superposition mode in which a transient sense voltage is superimposed on the sense voltage or a normal mode in which the transient sense voltage is not superimposed on the sense voltage; and a timing adjustment unit configured to adjust a detection start timing of the overcurrent detection signal based on a result of determination by the mode determination unit.

Advantageous Effects of Invention

According to an embodiment of the present invention, provided is an overcurrent protection device configured to accurately detect an overcurrent in a short time while preventing false detection of overcurrent during the turn-on time and the turn-off time of a voltage-controlled semiconductor device.

BRIEF DESCRIPTION OF THE DRAWINGS

FIG. 3 is a circuit diagram illustrating a concrete configuration of a filter circuit applicable to the present invention;

FIGS. 4A to 4C are timing charts for describing an operation of the filter circuit in FIG. 3;

FIGS. 5A to 5C are timing charts for describing an operation according to the first embodiment;

FIG. 6 is a characteristics graph illustrating relations between collector-emitter voltage and collector current for different gate voltages;

FIGS. 10A to 10C are timing charts illustrating changes in sense voltage of the gate drive circuit during the turn-on time.

DESCRIPTION OF EMBODIMENTS

Next, an embodiment of the present invention will now be described with reference to the drawings. In the following description of the drawings, the same or similar reference signs are assigned to the same or similar portions.

In addition, the following embodiment indicates devices and methods to embody the technical idea of the present invention by way of example, and the technical idea of the present invention does not limit the materials, shapes, structures, arrangements, and the like of the constituent components to those described below. The technical idea of the present invention can be subjected to a variety of alterations within the technical scope prescribed by the claims described in Claims.

A drive device of a semiconductor device according to an embodiment of the present invention will be described below with reference to the drawings. In the present embodiment, a voltage-driven semiconductor device is taken as an example of a semiconductor device and a gate drive unit of the semiconductor device will be described as an example.

First, a power conversion device 10 including a gate drive unit of a semiconductor device according to the present invention will be described with reference to FIG. 1.

Figure 1:
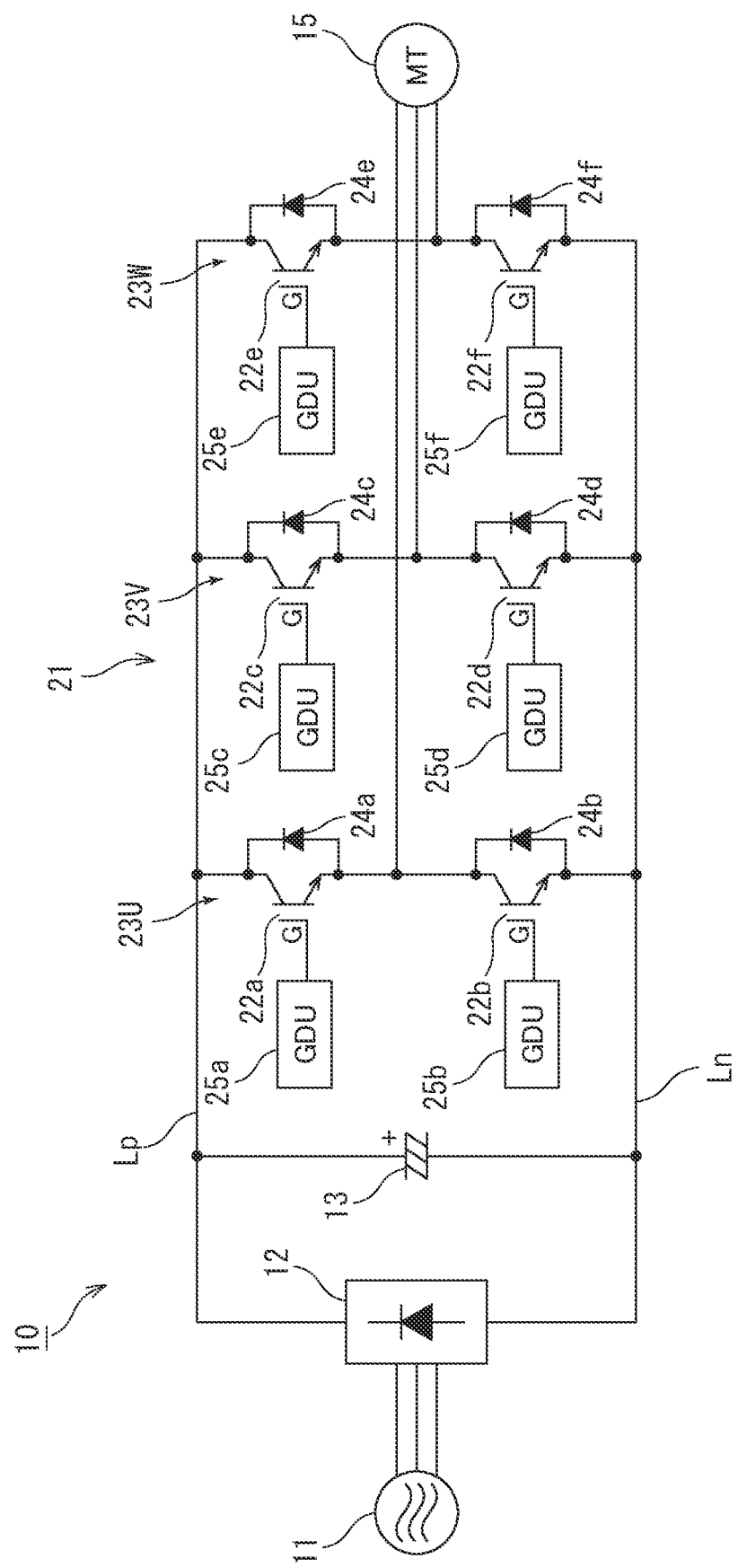
FIG. 1 is a circuit diagram illustrating a schematic configuration of a power conversion device including an overcurrent protection device for a semiconductor device according to a first embodiment of the present invention.

As illustrated in FIG. 1, the power conversion device 10 is connected to a three-phase AC power source 11. The power conversion device 10 includes a rectifying circuit 12 for full-wave rectification of three-phase AC power inputted from a three-phase AC power source 11 and a smoothing capacitor 13 to smooth the power rectified by the rectifying circuit 12. The rectifying circuit 12, though not illustrated, is formed of 6 diodes in full bridge connection or 6 switching devices in full bridge connection.

A positive line Lp is connected to the positive output terminal of the rectifying circuit 12 and a negative line Ln is connected to the negative output terminal. A smoothing capacitor 13 is connected between the positive line Lp and the negative line Ln.

The power conversion device 10 includes an inverter circuit 21 to convert the DC voltage applied across the positive line Lp and the negative line Ln to three-phase AC voltage. The inverter circuit 21 includes, for example, insulated gate bipolar transistors (referred to as IGBTs hereinafter) 22a, 22c, 22e as voltage-controlled semiconductor devices forming an upper arm unit connected to the positive line Lp and IGBTs 22b, 22d, 22f forming a lower arm unit connected to the negative line Ln.

The IGBT 22*a* and the IGBT 22*b* are connected in series between the positive line Lp and the negative line Ln to form a U-phase output arm 23U. The IGBT 22*c* and the IGBT 22*d* are connected in series between the positive line Lp and the negative line Ln to form a V-phase output arm 23V. The IGBT 22*e* and the IGBT 22*f* are connected in series between the positive line Lp and the negative line Ln to form a W-phase output arm 23W.

The IGBTs 22*a* to 22*f* are respectively connected with freewheeling diodes 24*a* to 24*f* in inverse parallel. In other words, the collectors of the IGBTs 22*a* to 22*f*, which are high potential electrodes, are respectively connected with the cathodes of the freewheeling diodes 24*a* to 24*f* while the emitters of the IGBTs 22*a* to 22*f*, which are low potential electrodes, are respectively connected with the anodes of the freewheeling diodes 24*a* to 24*f*.

The connection point of the IGBT 22*a* and the IGBT 22*b*, the connection point of the IGBT 22*c* and the IGBT 22*d*, and the connection point of the IGBT 22*e* and the IGBT 22*f* are each connected to the three-phase AC electric motor 15, which serves as a inductive load.

The power conversion device 10 further includes gate drive units (GDUs) 25*a* to 25*f* to respectively control the switching operations of the IGBTs 22*a* to 22*f*.

The output terminals of the gate drive units 25*a* to 25*f* are respectively connected with the gate electrodes, which serve as the control electrodes, of the IGBTs 22*a* to 22*f*.

Thus, the inverter circuit 21 includes a three-phase full bridge circuit with the U-phase output arm 23U, the V-phase output arm 23V, and the W-phase output arm 23W connected in parallel, the gate drive units 25*a*, 25*b* to control the switching operation of the U-phase output arm 23U, the gate drive units 25*c*, 25*d* to control the switching operation of the V-phase output arm 23V, and the gate drive units 25*e*, 25*f* to control the switching operation of the W-phase output arm 23W.

Next, a driving unit according to the present embodiment will be described, taking the gate drive unit 25*b* as an example with reference to FIG. 2, also referring to FIG. 1. The gate drive units 25*a*, 25*c*, 25*d*, 25*e*, and 25*f* are configured similarly to the gate drive unit 25*b*. Though not illustrated, the IGBTs 22*a* to 22*f* are each configured to have a main IGBT cell forming the main circuit and a sense IGBT forming a sensing circuit formed in parallel on a semiconductor substrate.

Figure 2:
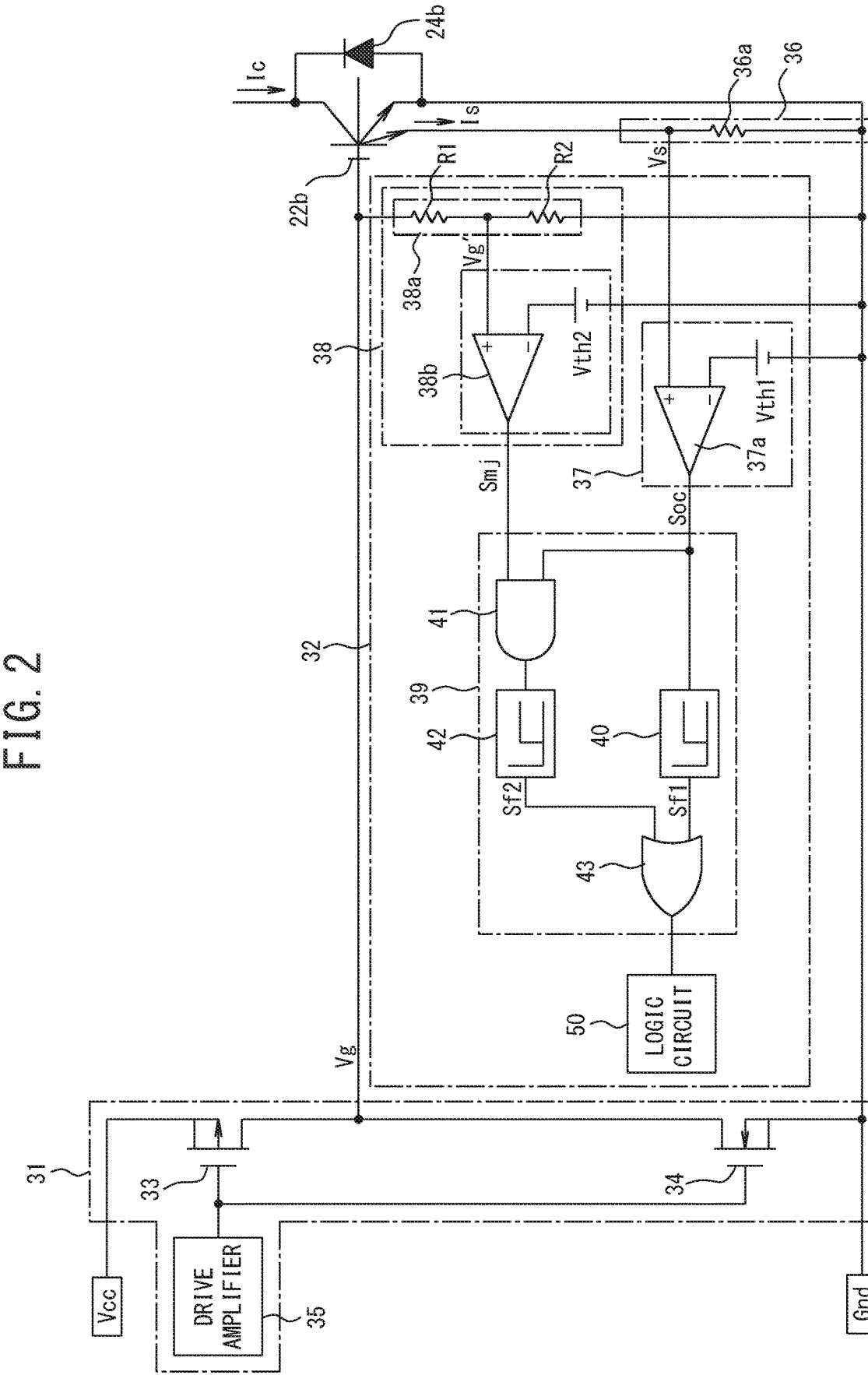
FIG. 2 is a circuit diagram illustrating an example of a gate drive unit in FIG. 1.

As illustrated in FIG. 2, the gate drive unit 25*b* includes a gate drive circuit 31 to drive the gate electrode of the IGBT 22*b* and an overcurrent protection device 32 to detect an overcurrent state of the IGBT 22*b* to protect it.

The gate drive circuit 31 includes a series circuit of a p-channel MOSFET 33 and an n-channel MOSFET 34 connected in series between the power source terminal and the ground and a drive amplifier 35 to drive the MOSFETs 33 and 34 in such a manner that, when one of the MOSFETs is in the ON state, the other is in the OFF state. The connection point of the MOSFETs 33 and 34 is connected with the gate terminal of the IGBT 22*b*.

The overcurrent protection device 32 includes a current detection unit 36 to detect sense current Is of the IGBT 22*b* as sense voltage Vs, an overcurrent detection unit 37 to compare the sense voltage detected in the current detection unit 36 with an overcurrent threshold voltage and to output an overcurrent detection signal, and a mode determination unit 38 to determine whether the superposition mode in which a transient sense voltage is superimposed on the sense voltage Vs or the normal mode in which the transient sense voltage is not superimposed on the sense voltage Vs.

The current detection unit 36 includes a current detection resistor 36*a* connected between the current sense terminal of the IGBT 22*b* (the emitter terminal of the sense IGBT) and the ground. Sense current Is is outputted as the sense voltage Vs from the connection point of the current sense terminal of the IGBT 22*b* and the current detection resistor 36*a*.

The overcurrent detection unit 37 includes a comparator 37*a* to compare the sense voltage Vs outputted by the current detection unit 36 with an overcurrent threshold voltage Vth1. The sense voltage Vs is inputted to the non-inverting input terminal of the comparator 37*a* and the overcurrent threshold voltage Vth1 is inputted to the inverting input terminal. The comparator 37*a* outputs an overcurrent detection signal Soc that turns from the low level to the high level when the sense voltage Vs becomes equal to or larger than the overcurrent threshold voltage Vth1.

The mode determination unit 38 determines the mode between the superposition mode and the normal mode on the basis of the gate voltage Vg supplied to the gate terminal of the IGBT 22*b*. The mode determination unit 38 includes a gate voltage detection unit 38*a* formed of a voltage-dividing circuit to detect gate voltage Vg and a comparator 38*b* serving as a comparison unit to compare the divided gate voltage Vg' outputted from the gate voltage detection unit 38*a* with a mode determination threshold voltage Vth2, to output a mode determination signal.

The gate voltage detection unit 38*a* includes resistors R1 and R2 connected in series between the gate terminal of the IGBT 22*b* and the ground. Divided gate voltage Vg' is outputted from the connection point of the resistors R1 and R2.

Divided gate voltage Vg' is supplied to the non-inverting input terminal of the comparator 38*b* and the mode determination threshold voltage Vth2 is inputted to the inverting input terminal of the comparator. The comparator 38*b* outputs a mode determination signal Smj, which turns from the low level to the high level when the divided gate voltage Vg' is equal to or larger than the mode determination threshold voltage Vth2.

The overcurrent protection device 32 includes a timing adjustment unit 39, into which the overcurrent detection signal Soc and the mode determination signal Smj are inputted to adjust the timing of the start of overcurrent detection. The timing adjustment unit 39 includes first filter circuit 40 serving as a first delay circuit, which is supplied with the overcurrent detection signal Soc outputted by the comparator 37*a* of the overcurrent detection unit 37.

The first filter circuit 40 is formed of a low-pass filter for which a time constant is set in such a manner as to delay the rise of the overcurrent detection signal Soc with a time lag equal to a false overcurrent detection prevention period T1 (for example, 3 μs), during which the transient sense voltage Vtr is superimposed on the sense voltage Vs of the IGBT 22*b* during the turn-on time and the turn-off time, and thus the sense voltage exceeds the overcurrent threshold voltage Vth1 but not to delay the fall of the overcurrent detection signal Soc.

In a specific configuration of the first filter circuit 40, as illustrated in FIG. 3, for example, a series circuit of a resister R11 and a capacitor C11 is connected between an input terminal ti, to which the overcurrent detection signal Soc is inputted, and the ground. The output from the connection point of the resister R11 and the capacitor C11 is inputted to a NOT circuit (inverter) 40*a*, the output from the NOT circuit 40*a* is inputted to a subsequent NOT circuit 40*b*, and the output from the NOT circuit 40*b* is outputted from an output terminal to as a filter output Sf1.

An n-channel MOSFET 40c serving as a switching device is connected in parallel with the capacitor C11 and the overcurrent detection signal Soc inputted to the input terminal ti is inputted to the gate of the n-channel MOSFET 40c through a NOT circuit 40d.

An operation of the first filter circuit 40 will be described with reference to FIGS. 4A to 4C. As illustrated in FIG. 4A, when the overcurrent detection signal Soc inputted to the input terminal ti is at the low level, the overcurrent detection signal Soc is inverted in the NOT circuit 40d and supplied to the gate of the n-channel MOSFET 40c. Accordingly, the n-channel MOSFET 40c is in the ON state, the electric charge stored in the capacitor C11 is discharged, the output of the NOT circuit 40a is at the high level, and the output of the NOT circuit 40b is at the low level.

From this state, when the overcurrent detection signal Soc inputted to the input terminal ti turns to the high level at time t11, the output of the NOT circuit 40d turns to the low level, and the n-channel MOSFET 40c turns to the OFF state. Accordingly, due to the overcurrent detection signal Soc at the high level inputted to the input terminal ti, current flows through the resistor R11 and is stored in the capacitor C11, raising the voltage Vc at the connection point of the resister R11 and the capacitor C11 as illustrated in FIG. 4B.

The output of the NOT circuit 40a stays at the low level until the voltage Vc equals the overcurrent threshold voltage Vth1 of the NOT circuit 40a. When the voltage Vc exceeds the threshold voltage Vth1 at time t12, the output of the NOT circuit 40a turns from the high level to the low level, and the output of the NOT circuit 40b turns from the low level to the high level and is outputted as the filter output Sf1.

For the first filter circuit 40, the period T11 from time t11 to time t12 is set for a duration equal to a detection time T0 equal to the sum of the above-described false overcurrent detection prevention period T1 (for example, 3 μs), in which the transient sense voltage Vtr is superimposed on the sense voltage Vs and the sense voltage exceeds the overcurrent threshold voltage Vth1 in the superposition mode during the turn-on time of the IGBT 22b, and a detection period T2 (for example, 1 μs).

Therefore, in the superposition mode, in which the transient sense voltage Vtr is superimposed on the sense voltage Vs during the turn-on time, the first filter circuit 40 outputs a filter output Sf1 in which the rise of the overcurrent detection signal Soc is delayed during the superposition mode with a time lag equal to the period T11 (=4 μs) from the moment when the overcurrent detection signal Soc turns to the high level. Note that, when the overcurrent detection signal Soc falls, the output of the NOT circuit 40a turns from the low level to the high level, the n-channel MOSFET 40c turns on, and voltage Vc immediately equals 0V, and therefore no delay occurs.

The timing adjustment unit 39 includes an AND gate 41, to which the overcurrent detection signal Soc outputted by the comparator 37a of the overcurrent detection unit 37 and the mode determination signal Smj outputted by the comparator 38b of the mode determination unit 38 are inputted, and a second filter circuit 42, to which the output of the AND gate 41 is inputted.

The second filter circuit 42 is configured similarly to the above-described first filter circuit 40 although with a smaller time constant set by the resistor R11 and the capacitor C11 than that of the first filter circuit 40, and outputs a filter output Sf2, produced by delaying the rise time of the overcurrent detection signal Soc inputted through the AND gate 41 with a time lag equal to a detection period T12 (=1 μs) corresponding to the detection period T2 in FIGS. 10A to 10C.

The timing adjustment unit 39 includes an OR gate 43, to which the filter output Sf1 of the first filter circuit 40 and the filter output Sf2 of the second filter circuit 42 are inputted. The OR gate 43 outputs an overcurrent detection signal that prevents false detection of overcurrent in the superposition mode during the turn-on time and the turn-off time of the IGBT 22b and restrains delays in overcurrent detection in the normal mode.

The overcurrent detection signal outputted by the timing adjustment unit 39 is supplied to the logic circuit 50. When the overcurrent detection signal outputted by the timing adjustment unit 39 is at the high level, the logic circuit 50 determines that an overcurrent has occurred and puts the p-channel MOSFET 33 into the OFF state and the n-channel MOSFET into the ON state to decrease the gate voltage applied to the gate of the IGBT 22b to put the IGBT 22b into the OFF state. This prevents the IGBT 22b from continuing to be in an overcurrent state.

An operation of the above-described embodiment will be described next.

Assume that at present the IGBT 22b remains in the OFF state. To turn on the IGBT 22b from this state, the p-channel MOSFET 33 is turned on and the n-channel MOSFET 34 is turned off at time t21 as illustrated in FIGS. 5A to 5C, using the drive amplifier 35. This causes the power source voltage Vcc to be applied to the gate of the IGBT 22b, gate current flows between the gate and the emitter to charge the gate capacitance, and the gate voltage Vg increases from 0V as illustrated in FIG. 5A.

At this time, as the gate current of the sense IGBT flows through the current sense terminal, a transient sense voltage Vtr1 occurs due to the effect of the gate current.

At the same time, as the gate voltage Vg is low during the charge of the gate capacitance, the on-voltage of the IGBT 22b at which collector current Ic starts to flow is higher than in the case when the gate voltage Vg is high, as illustrated in FIG. 6. In other words, the on-resistance of the IGBT 22b is higher. Accordingly, the ratio of the resistance of the sense unit consisting of the on-resistance of the sense IGBT and the current detection resistor 36a of the current detection unit 36 becomes relatively small, which increases sense current Is and leads to an occurrence of a transient sense voltage Vtr2 as a function of the sense current increase.

Table 1 below compares the case when the gate voltage Vg is low and the case when the gate voltage Vg is high with respect to the IGBT on-resistance, the sense IGBT on-resistance, the ratio of the current detection unit resistance, the sense current Is, and the sense voltage Vs.

TABLE 1

| | Gate Voltage | |
|---|---|---|
| | Low | High |
| Main IGBT ON-Resistance | High | Low |
| Sense IGBT ON-Resistance | High | Low |
| Ratio of Sense Unit Resistance | Low | High |
| Sense Current | Large | Small |
| Sense Voltage | Large | Small |

As these transient sense voltages Vtr1 and Vtr2 are superimposed on the sense voltage Vs, the sense voltage Vs increases, as illustrated in FIG. 5B.

Subsequently, the gate voltage Vg equals the Miller voltage Vm at time t22 and the Miller period starts, during which the gate voltage Vg remains constant at the Miller voltage Vm as the gate-collector capacitance Cgc is charged.

In the Miller period, the collector current Ic increases sharply as illustrated in FIG. 5C and the sense voltage Vs also increases in proportion to the collector current Ic as illustrated in FIG. 5B. The collector current Ic overshoots and then shifts to a constant current state. Accordingly, the sense voltage Vs also overshoots and then shifts to a first constant voltage state.

Subsequently, when the charging of the gate-collector capacitance Cgc is completed at time t23 terminating the Miller period, the gate voltage Vg increases to the power source voltage Vcc and the sense voltage Vs shifts to a second constant voltage state, which is lower than the first constant voltage state.

During the Miller period, the sense voltage Vs exceeds the overcurrent threshold voltage Vth1 and the overcurrent detection signal Soc outputted by the overcurrent detection unit 37 turns to the high level. During the turn-on time, however, as the gate voltage Vg is lower than the power source voltage Vcc and the divided gate voltage Vg', divided by the resistors R1 and R2 of the gate voltage detection unit 38a, is lower than the mode determination threshold voltage Vth2, the mode determination signal Smj outputted by the comparator 38b of the mode determination unit 38 stays at the low level, which indicates the superposition mode in which the transient sense voltage is superimposed on the sense voltage Vs.

As this low-level mode determination signal Smj is supplied to the AND gate 41 of the timing adjustment unit 39, the output of the AND gate 41 stays at the low level, shutting down the supply of the overcurrent detection signal Soc to the second filter circuit 42. Thus the output by the second filter circuit 42 stays at the low level.

Consequently, the overcurrent detection signal Soc outputted by the overcurrent detection unit 37 is supplied only to the first filter circuit 40 and, as described above with reference to FIGS. 4A to 4C, the first filter circuit 40 holds the filter output Sf1 corresponding to the high-level overcurrent detection signal Soc at the low level for the period T11 corresponding to the false overcurrent detection prevention period T1 (for example, 3 µs) during the turn-on time and, only after the period T11 transpires, the filter output Sf1 turns to the high level in accordance with the overcurrent detection signal Soc.

Nonetheless, as at the end of period T11 the sense voltage Vs is lower than the overcurrent threshold voltage Vth1 and the overcurrent detection signal Soc is at the low level, the filter output Sf1 of the first filter circuit 40 stays at the low level. Thus, the logic circuit 50 does not perform overcurrent protection operation, preventing false operation during the turn-on time, which would have been caused since the transient sense voltages Vtr1 and Vtr2 of the IGBT 22b are superimposed on the sense voltage Vs and the sense voltage Vs exceeds the overcurrent threshold voltage Vth1.

Subsequently, to turn off the IGBT 22b from the ON state at time t24, the drive amplifier 25 is used to control the p-channel MOSFET 33 into the OFF state and the n-channel MOSFET 34 into the ON state. This causes the gate voltage Vg to start to decrease as illustrated in FIG. 5A and at time t25 the Miller period starts, in which the gate voltage Vg remains constant as the charge stored in the gate-collector capacitance Cgc is discharged. Subsequently, as the Miller period terminates at time t26 in the Miller period, the gate voltage Vg decreases.

During the turn-off time of the IGBT 22b, as the gate capacitance is discharged and the gate voltage Vg decreases, the on-voltage of the IGBT 22b increases and the on-resistance of the IGBT 22b increases, as during the turn-on time. At this time, the ratio of the resistance of the sense unit consisting of the on-resistance of the sense IGBT and the current detection resistor 36a of the current detection unit 36 becomes relatively small, and thus the sense current Is is increased, the transient sense voltage Vtr2 is superimposed on the sense voltage Vs to make the sense voltage Vs lager as illustrated in FIG. 5B, and the sense voltage Vs exceeds the overcurrent threshold voltage Vth1.

During the turn-off time, the gate voltage Vg is below the mode determination threshold voltage Vth2 and the mode determination signal Smj outputted by the comparator 38b of the mode determination unit 38 is at the low level. Accordingly, the AND gate 41 of the timing adjustment unit 39 is closed as during the turn-on time (the output is fixed at the low level). Accordingly, the overcurrent detection signal Soc outputted by the comparator 37a of the overcurrent detection unit 37 is not supplied to the second filter circuit 42 but only to the first filter circuit 40.

As the first filter circuit 40 holds the output Sf1 at the low level for the period T11, which corresponds to the period during which the overcurrent detection signal Soc is at the high level, preventing the high-level overcurrent detection signal Soc from being supplied to the logic circuit 50 as it is.

Accordingly, false operation of overcurrent protection operation by the logic circuit 50 is prevented also during the turn-off time of the IGBT 22b even when the transient sense voltage Vtr is superimposed on the sense voltage Vs and the sense voltage Vs exceeds the overcurrent threshold voltage Vth1.

An overcurrent protection operation will be described next with reference to FIGS. 7A to 7F.

Figure 7A:
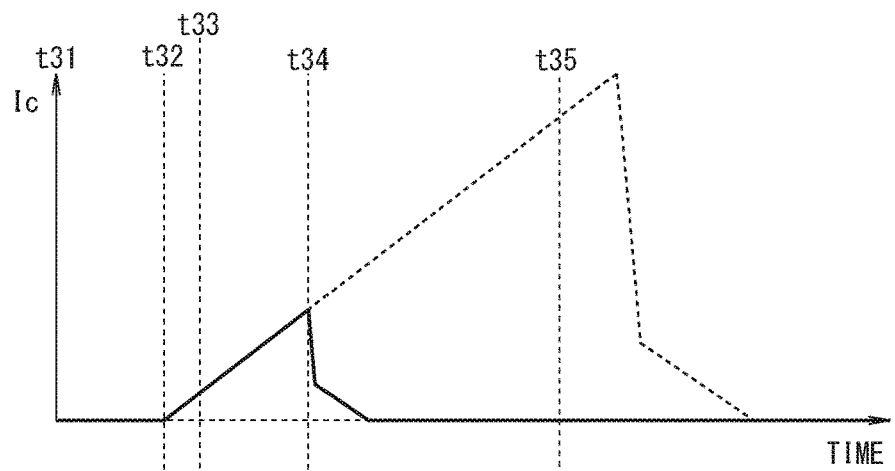
FIGS. 7A to 7F are timing charts for describing overcurrent protection operation.
Figure 7B:
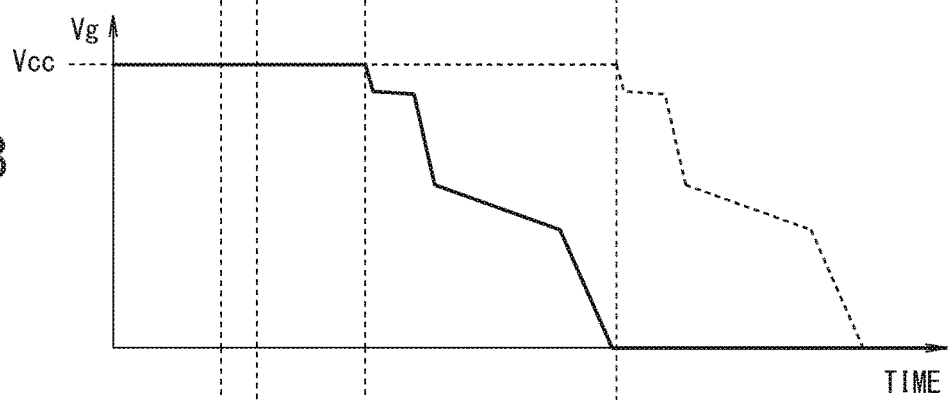
Figure 7C:
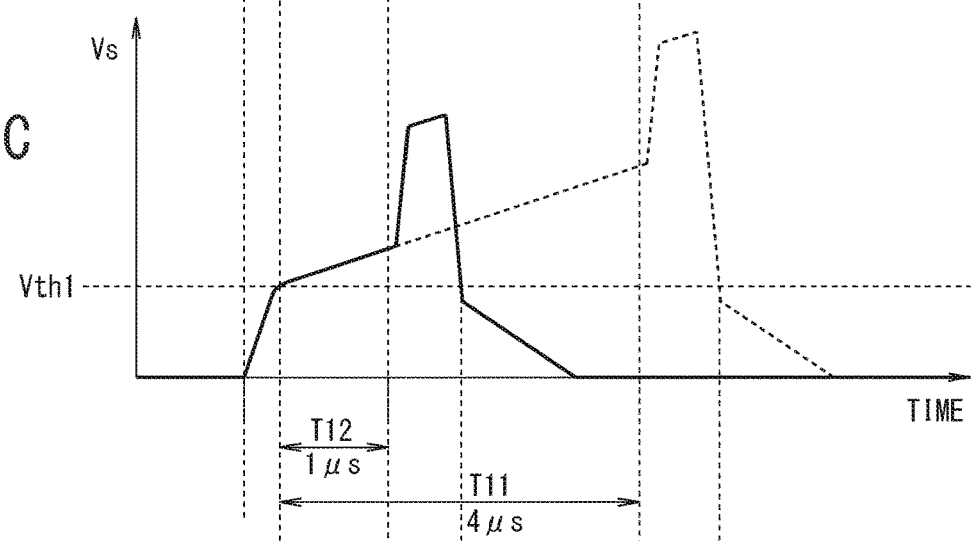

Assume that presently at time t31, the gate voltage Vg of the IGBT 22b is equal to the power source voltage Vcc as illustrated in FIG. 7B, that the collector current Ic is 0 A (no current flows through the load), that, accordingly, the sense voltage Vs is also 0V as illustrated in FIG. 7C, and that the IGBT 22b is in the ON state. In this ON state, the gate voltage Vg is equal to the power source voltage Vcc and the divided gate voltage Vg' is equal to or more than the mode determination threshold voltage Vth2. In the mode determination unit 38, therefore, the mode determination signal Smj outputted by the comparator 38b is at the high level, indicating the normal mode. Accordingly, the AND gate 41 of the timing adjustment unit 39 is open and the overcurrent detection signal Soc outputted by the overcurrent detection unit 37 is supplied to the second filter circuit 42.

During the ON state of the IGBT 22b, when at time t32 the collector current Ic starts to increase from 0A (current starts to flow through the load) as illustrated in FIG. 7A, the sense voltage Vs also starts to increase in the wake of this, as illustrated in FIG. 7C.

Figure 7D:
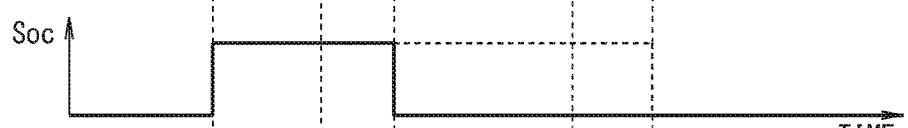
Figure 7E:
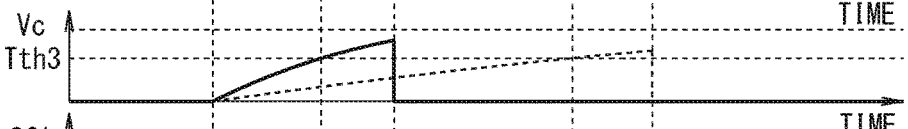

Subsequently, when the sense voltage Vs equals the overcurrent threshold voltage Vth1 at time t33 as illustrated in FIG. 7C, the overcurrent detection signal Soc outputted by the comparator 37a of the overcurrent detection unit 37 turns from the low level to the high level as illustrated in FIG. 7D.

As the overcurrent detection signal Soc is supplied to the second filter circuit 42 through the AND gate 41 and the capacitor C11 of the second filter circuit 42 is charged through the resistor R11, the voltage Vc across the terminals of the second filter circuit 42 increases from 0V. Until the voltage Vc across the terminals equals the threshold voltage Vth3 of the NOT circuit 40a, the output of the NOT circuit 40a stays at the high level and gets inverted by the subsequent NOT circuit 40b to the low level, then is outputted as the filter output Sf2 to the OR gate 43.

Similarly, the first filter circuit 40 is also supplied with the high-level overcurrent detection signal Soc but the filter output Sf1 also stays at the low level as the time constant set by the resister R11 and the capacitor C11 of the first filter circuit 40 is larger than that of the second filter circuit 42.

Figure 7F:
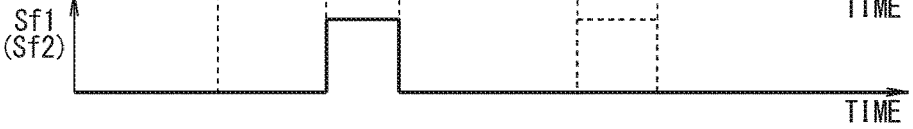

Subsequently, when at time t34 the voltage Vc across the terminals of the capacitor C11 of the second filter circuit 42 equals the threshold voltage Vth3 of the NOT circuit 40a, the output of the NOT circuit 40a turns to the low level and the output signal of the subsequent NOT circuit 40b turns to the high level. The filter output Sf2 of the second filter circuit 42 accordingly turns to the high level as illustrated in FIG. 7F.

As the filter output Sf2 is supplied to the logic circuit 50 through the OR gate 43, the logic circuit 50 performs overcurrent protection operation. The overcurrent protection operation is made possible by providing a soft shutdown circuit in the gate drive circuit 31 or by providing a soft shutdown circuit between the gate drive circuit 31 and the gate of the IGBT 22b to gradually decrease the gate voltage by the operation of the soft shutdown circuit.

As described above, when there is an overcurrent state, with the IGBT 22b in the ON state, the overcurrent detection unit 37 outputs a high-level overcurrent detection signal Soc, which is supplied to the first filter circuit 40 and the second filter circuit 42. At this time, since the second filter circuit 42 has a smaller time constant and a shorter delay time than those of the first filter circuit 40, the second filter circuit 42 outputs a filter output Sf2, which turns to the high level after the overcurrent detection signal Soc turns to the high level with a time lag equal to the detection period T12 (for example, 1 μs). By supplying the filter output Sf2 to the logic circuit 50 though the OR gate 43, the IGBT 22b is brought to a soft shutdown in a short time after the IGBT 22b enters into an overcurrent state, to securely perform overcurrent protection.

In this connection, in a case where the overcurrent protection device 32 includes the first filter circuit 40 only and the second filter circuit 42 is omitted, a relatively long false operation detection prevention period T11 (for example, 4 μs) needs to be set to prevent false operation of overcurrent protection due to the false detection of overcurrent during the turn-on time and the turn-off time, by using the first filter circuit 40.

Therefore, when only the first filter circuit 40 is provided, the first filter circuit 40 outputs a filter output Sf1, which turns to the high level after the overcurrent detection signal Soc turns to the high level with a time lag four times as long as the delay time of the second filter circuit 42. The timing of soft shutdown of the gate voltage Vg of the IGBT 22b will accordingly delay as indicated by the dotted line in FIG. 7B. Consequently, the collector current Ic will be a value at a very high overcurrent level at the start of the soft shutdown as indicated by the dotted line in FIG. 7A, impacting the operation of the IGBT 22b. Similarly, the sense voltage Vs will increase as indicated by the dotted line in FIG. 7C.

In contrast, according to the present embodiment, in the superposition mode, in which the divided gate voltage Vg' of the gate voltage Vg is below the mode determination threshold voltage Vth2 during the turn-on time when the transient sense voltages Vtr1 and Vtr2 are superimposed on the sense voltage Vs and during the turn-off time when the transient sense voltage Vtr2 is superimposed on the sense voltage Vs, false operation of overcurrent protection operation is prevented by delaying the rise of the overcurrent detection signal Soc for a long delay time with the first filter circuit 40.

In the normal mode, in which the IGBT 22b is in the ON state, the divided gate voltage Vg' of the gate voltage Vg is equal to or more than the mode determination threshold voltage Vth2, and the transient sense voltage Vtr1 or Vtr2 is not superimposed on the sense voltage Vs, overcurrent protection operation is started after a short detection period T12 (for example, 1 μs), by delaying the rise of the overcurrent detection signal Soc for a short delay time using the second filter circuit 42.

Besides, accurate overcurrent protection operation is ensured by a simple configuration for determining the timing of the start of the operation, using the first filter circuit 40 and the second filter circuit 42 as well as the mode determination unit 38 to determine a mode between the superposition mode and the normal mode, allowing the overcurrent detection signal Soc to be inputted to the second filter circuit 42 in the normal mode.

In addition, employing the first filter circuit 40 and the second filter circuit 42 as delay circuits for the timing adjustment unit 39 and arranging the first filter circuit 40 and the second filter circuit 42 in low pass filter configurations removes high frequency noise superimposed onto the overcurrent detection signal Soc.

The mode determination threshold voltage Vth2 is preferably a voltage corresponding a gate voltage Vg larger than the Miller voltage Vm and smaller than the power source voltage Vcc.

Figure 8:
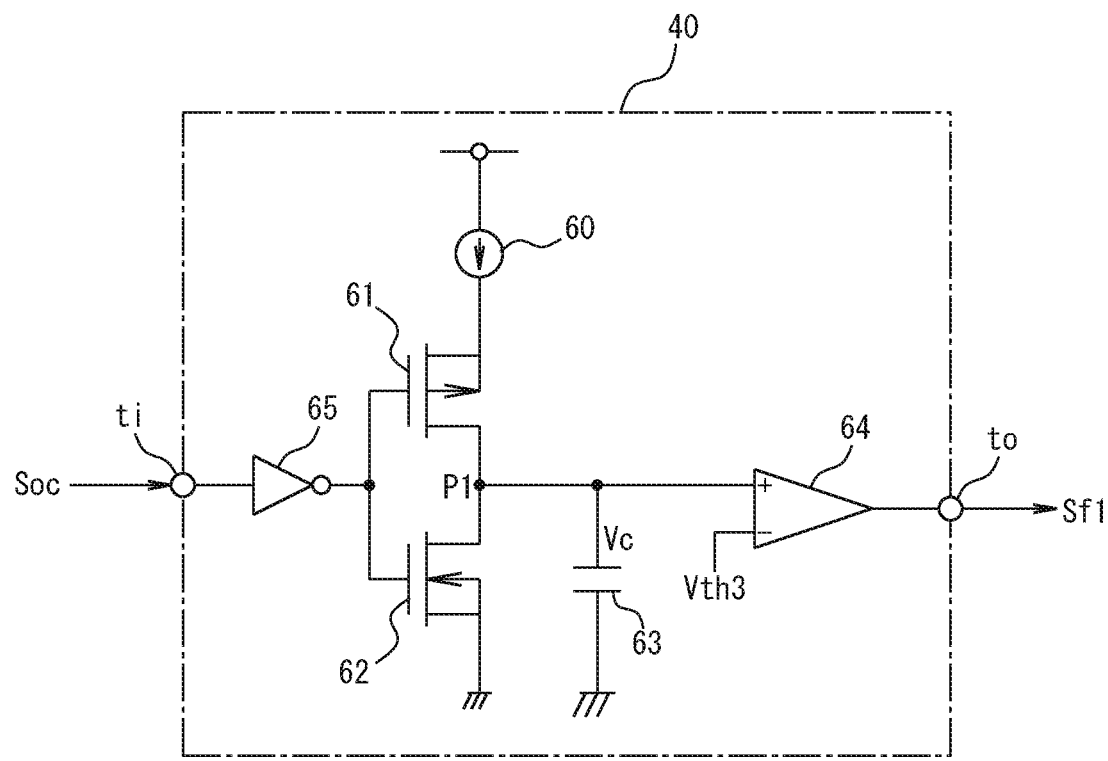
FIG. 8 is a circuit diagram illustrating a modified example of the filter circuit.

In the above-described embodiment, a case in which the first filter circuit 40 and the second filter circuit 42 are configured as illustrated in FIG. 3 has been described. However, the first filter circuit 40 and the second filter circuit 42 may be configured as illustrated in FIG. 8. More specifically, in this configuration the power source terminal is connected through a constant current circuit 60 to the source of a p-channel MOSFET 61 serving as a first switching device, the drain of the p-channel MOSFET 61 is grounded through an n-channel MOSFET 62 serving as a second switching device, a capacitor 63 is connected between the ground and the connection point P1 of the p-channel MOSFET 61 and the n-channel MOSFET 62 and then the connection point of the connection point P1 and the capacitor 63 is connected to the non-inverting input terminal of a comparator 64.

The input terminal, to which the overcurrent detection signal Soc is inputted, for example, is connected through a NOT circuit 65 to the gates of the p-channel MOSFET 61 and the n-channel MOSFET 62, a threshold voltage Vth3 is inputted to the inverting input terminal of a comparator 64, and the output terminal of the comparator 64 is connected to the output terminal to.

Figure 9A:
FIGS. 9A to 9C are timing charts for describing an operation of the filter circuit in FIG. 8.
Figure 9B:
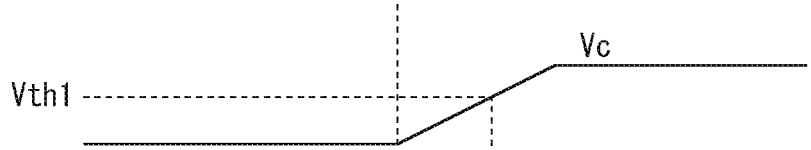

According to this configuration, when the overcurrent detection signal Soc turns to the high level as illustrated in FIG. 9A, the p-channel MOSFET 61 is in the ON state and the constant current outputted by the constant current circuit 60 charges the capacitor 63. This increases the voltage Vc across the terminals of the capacitor 63 linearly as illustrated in FIG. 9B.

Figure 9C:
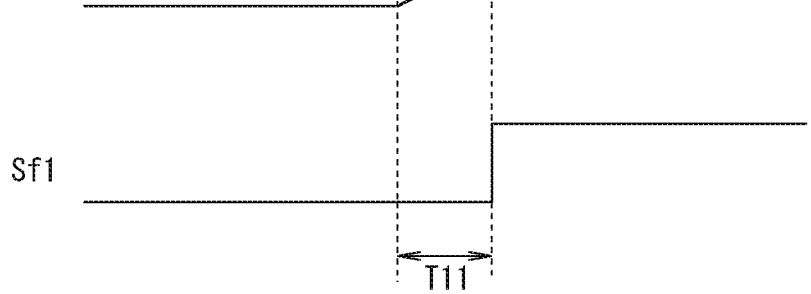

The voltage Vc across the terminals of the capacitor 63 is supplied to the comparator 64 and compared with the threshold voltage Vth3. When the charge voltage Vc of the capacitor is equal to or more than the threshold voltage Vth3, a filter output Sf1 at the high level is outputted as illustrated in FIG. 9C. In other words, when the overcurrent detection signal Soc turns from the low level to the high level, the filter output Sf1 turns to the high level with a time lag of a period T11 as illustrated in FIG. 9C. Note that, when the overcurrent detection signal Soc turns from the high level to the low level, the n-channel MOSFET 62 turns on, and the charge voltage Vc of the capacitor immediately falls to 0V, causing no delay in the filter output Sf1.

Thus, by employing the first filter circuit 40 and the second filter circuit 42 in a configuration illustrated in FIG. 8, similar operational effects are obtained as in FIG. 3. In this case, the capacitor 63 is charged by the constant current outputted by the constant current circuit 60 and hence the delay time of the rise of the overcurrent detection signal Soc can be set accurately.

Further, one of the first filter circuit 40 and the second filter circuit 42 may be configured as illustrated in FIG. 3 while the other configured as illustrated in FIG. 8. Still further, as the first filter circuit 40 and the second filter circuit 42 various delay circuits of any configuration may be employed as long as they can delay the rise of the overcurrent detection signal Soc.

The switching devices for the gate drive circuit 31, the first filter circuit 40, and the second filter circuit 42 are not limited to MOSFETs but may be bipolar transistors or other switching devices.

In the above-described embodiment the power conversion device 10 has been described as including a rectifying circuit to convert three-phase AC power supplied by the three-phase AC power source 11 into DC power but power sources are not limited to this. Instead of the three-phase AC power source 11 a single-phase AC power source may be employed and, further, a DC source such as a battery may be used.

The scope of the invention, not being limited to the exemplifying embodiments shown in the drawings, also includes all embodiments providing an advantage equivalent to that which the invention has as an object. Furthermore, the scope of the invention, not being limited to the combinations of characteristics of the invention defined by the claims, may be defined by any desired combination of specific characteristics among all disclosed characteristics.

REFERENCE SIGNS LIST 10 power conversion device
11 three-phase AC power source
12 rectifying circuit
13 smoothing capacitor
15 three-phase AC electric motor
21 inverter circuit
22a to 22f IGBT
23U U-phase output arm
23V V-phase output arm
23W W-phase output arm
24a to 24f freewheeling diode
25a to 25f gate drive unit
31 gate drive circuit
32 overcurrent protection device
33 p-channel MOSFET
34 n-channel MOSFET
35 drive amplifier
36 current detection unit
37 overcurrent detection unit
38 mode determination unit
38a gate voltage detection unit
38b comparator
39 timing adjustment unit
40 first filter circuit
40a, 40b NOT circuit
40c n-channel MOSFET
40d NOT circuit
41 AND gate
42 second filter circuit
43 OR gate
50 logic circuit
R11 resistor
C11 capacitor
60 constant current circuit
61 p-channel MOSFET
62 n-channel MOSFET
63 capacitor
64 comparator
65 NOT circuit

The invention claimed is:

1. An overcurrent protection device for a semiconductor device, comprising:
 a current detection circuit configured to detect, as a sense voltage, a sense current flowing through a current sense terminal of the semiconductor device;
 an overcurrent detection circuit configured to compare the sense voltage detected by the current detection circuit with an overcurrent threshold value to output an overcurrent detection signal;
 a mode determination circuit configured to determine a superposition mode in which a transient sense voltage caused by a gate current of the voltage-controlled semiconductor device flowing through the current sense terminal is superimposed on the sense voltage or a normal mode in which the transient sense voltage is not superimposed on the sense voltage; and
 a timing adjustment circuit configured to adjust a delay time of the overcurrent detection signal based on a result of the determination by the mode determination circuit, and when the result of the determination of the mode determination circuit indicates the superposition mode, the timing adjustment circuit is configured to ignore the overcurrent detection signal, which is output by the overcurrent detection circuit to the timing adjustment circuit, for a predetermined period of time.

2. The overcurrent protection device according to claim 1, wherein the mode determination circuit includes a gate voltage detection circuit configured to detect a gate voltage supplied to a gate terminal of the semiconductor device and a comparison circuit configured to determine the superposition mode or the normal mode based on whether or not the gate voltage detected by the gate voltage detection circuit is below a threshold voltage.

3. The overcurrent protection device according to claim 1, wherein the mode determination circuit includes:
 a voltage-dividing circuit having a plurality of resistors connected in series, configured to detect a divided gate voltage of a gate voltage supplied to a gate terminal of the semiconductor device, the divided gate voltage being output from a connection point between resistors among the plurality of resistors, and
 a comparison circuit configured to determine the superposition mode or the normal mode based on whether the divided gate voltage is below a threshold voltage.

4. An overcurrent protection device for a semiconductor device, comprising:
 a current detection circuit configured to detect, as a sense voltage, a sense current flowing through a current sense terminal of the semiconductor device;

an overcurrent detection circuit configured to compare the sense voltage detected by the current detection circuit with an overcurrent threshold value to output an overcurrent detection signal;

a mode determination circuit configured to determine a superposition mode in which a transient sense voltage is superimposed on the sense voltage or a normal mode in which the transient sense voltage is not superimposed on the sense voltage; and a timing adjustment circuit configured to adjust a detection start timing of the overcurrent detection signal based on a result of the determination by the mode determination circuit, the timing adjustment circuit including a first delay circuit configured to set a first false detection prevention period to the overcurrent detection signal when the result of the determination of the mode determination circuit indicates the superposition mode and a second delay circuit configured to set a second false detection prevention period shorter than the first false detection prevention period to the overcurrent detection signal when the result of the determination of the mode determination circuit indicates the normal mode.

5. The overcurrent protection device according to claim 4, wherein the first delay circuit and the second delay circuit each include a filter circuit including:
 a resistor with an end to which the overcurrent detection signal is inputted;
 a NOT circuit with an input terminal connected to another end of the resistor;
 a capacitor inserted between the ground and a connection point of the resistor and the NOT circuit; and
 a switching device connected with the capacitor in parallel, the switching device being conductive during the false detection prevention period of the overcurrent detection signal.

6. The overcurrent protection device according to claim 4, wherein the first delay circuit and the second delay circuit each include a filter circuit including:
 a constant current circuit;
 a first switching device and a second switching device that are connected to each other complementarily between the constant current circuit and the ground;
 a capacitor inserted between the ground and a first connection point of the first switching device and the second switching device; and
 a comparison circuit configured to compare a voltage at a second connection point of the capacitor and the first connection point with a threshold voltage.

7. An overcurrent protection device for a semiconductor device, comprising:
 a current detection circuit configured to detect, as a sense voltage, a sense current flowing through a current sense terminal of the semiconductor device;
 an overcurrent detection circuit configured to compare the sense voltage detected by the current detection circuit with an overcurrent threshold value to output an overcurrent detection signal;
 a mode determination circuit configured to determine a superposition mode in which a transient sense voltage is superimposed on the sense voltage or a normal mode in which the transient sense voltage is not superimposed on the sense voltage, and to output a mode determination signal based on a result of the determination of the superposition mode or the normal mode; and
 a timing adjustment circuit, connected to the overcurrent detection circuit and the mode determination circuit, configured to adjust a detection start timing of the overcurrent detection signal based on the mode determination signal which is output by the mode determination circuit to the timing adjustment circuit and the overcurrent detection signal which is output by the overcurrent detection circuit to the timing adjustment circuit.

8. The overcurrent protection device according to claim 7, wherein the mode determination circuit includes:
 a voltage-dividing circuit having a plurality of resistors connected in series, configured to detect a divided gate voltage of a gate voltage supplied to a gate terminal of the semiconductor device, the divided gate voltage being output from a connection point between resistors among the plurality of resistors, and
 a comparison circuit configured to determine the superposition mode or the normal mode based on whether the divided gate voltage is below a threshold voltage.

* * * * *